United States Patent [19]

Goren

[11] 4,108,654

[45] Aug. 22, 1978

[54] COLOR ELECTROPHOTOGRAPHIC PROCESS EMPLOYING A DOCUMENT SCREEN

[75] Inventor: Robert N. Goren, Rochester, N.Y.

[73] Assignee: Xerox Corporation, Stamford, Conn.

[21] Appl. No.: 467,326

[22] Filed: May 6, 1974

[51] Int. Cl.[2] .................... G03G 15/01; G03G 13/01; G03F 5/00

[52] U.S. Cl. .................... 96/1.2; 96/118

[58] Field of Search .................... 96/1.2, 45, 117, 118

[56] References Cited

U.S. PATENT DOCUMENTS

| | | | |
|---|---|---|---|
| 1,003,720 | 9/1911 | Dufay | 96/118 |
| 1,028,337 | 6/1912 | Eastman | 96/118 X |
| 1,439,035 | 12/1922 | Stuart | 96/118 |
| 1,892,901 | 1/1933 | O'Neill | 96/118 |
| 3,109,239 | 11/1963 | Wicker et al. | 96/118 X |
| 3,158,479 | 11/1964 | Pluess | 96/45 |
| 3,413,117 | 11/1968 | Gaynor | 96/1.2 |
| 3,519,423 | 7/1970 | Sharp | 96/118 X |
| 3,627,526 | 12/1971 | Donald | 96/1.8 X |
| 3,764,311 | 10/1973 | Beal | 96/45 X |
| 3,836,363 | 9/1974 | Plutchak | 96/1.2 |
| 3,912,510 | 10/1975 | Marks | 96/1.2 X |

*Primary Examiner*—Roland E. Martin, Jr.
*Assistant Examiner*—John L. Goodrow
*Attorney, Agent, or Firm*—J. J. Ralabate; C. A. Green; H. Fleischer

[57] ABSTRACT

The present invention is directed toward a color electrophotographic imaging process and a method for extending the range capabilities of said process. The process includes providing a document screen adapted to be used at the exposure station proximate to the image face of a document to be copied, such that light reflected from the screened document is passed through a lens system and imaged onto a photosensitive member. The document screen consists of a clear transparent base member having a dot pattern comprising dots of at least one color, preferably dots of two or more different colors. The frequency of the like dots is such that the optical system employed in the electrophotographic process passes spatial frequencies reflected from the screened original at the fundamental screen frequency but attenuates the harmonic spatial frequencies. The developed image is found to consist of a plurality of halftone colored dots of varying sizes, the dot sizes varying in accordance with the reflectivity or optical density of the original document.

14 Claims, 6 Drawing Figures

COLOR ELECTROPHOTOGRAPHIC PROCESS EMPLOYING A DOCUMENT SCREEN

BACKGROUND OF THE INVENTION

The present invention relates to electrophotographic processes. More specifically, the present invention relates to halftone color screening techniques for extending the range of relatively high contrast electrophotographic processes such as color xerography.

In the process of electrophotographic printing, as described in U.S. Pat. No. 2,297,691 issued to Carlson in 1942, the photoconductive surface has an electrostatic latent image recorded thereon. In the usual method of carrying out the process, the photoconductive surface is electrostatically charged substantially uniformly over its surface and then exposed to a light pattern of the image being reproduced to thereby discharge the charge in the irradiated areas of the charged photoconductive surface. The undischarged areas of the photoconductive surface thus form an electrostatic latent image in conformity with the configuration of the original light pattern.

The electrostatic latent image can then be developed by contacting it with a finely divided electrostatically attractable material such as a toner powder. The powder is held in image areas by the electrostatic field pattern on the photoconductive surface. Where the field is least, little or no material is deposited. Thus, a powder image is produced in conformity with a light image of the copy being reproduced. The powder is subsequently transferred to a sheet of paper, plastic, or any other suitable surface and affixed thereto to form a permanent print.

This basic process of electrophotographic printing may be utilized to produce color reproductions by slightly altering the aforementioned basic steps as, for example, disclosed in U.S. Pat. No. 3,531,195. Such color reproductions are accomplished by repeating the usual techniques of (1) charging the photoconductive surface, (2) exposing it to one color component of the subject matter to be reproduced, (3) developing the photoconductive surface with the appropriate toner, (4) transferring the toner image onto a support material in a selected repeated cycles of operations. The number of times the basic sequence for color reproduction is repeated depends on the number of colors utilized to develop the image. During each cycle a different color separation filter is utilized to selectively absorb and thereby transmit light of selected wavelengths to the photoconductive surface whereupon the photoconductive surface is discharged to a proper level. After the first exposure, using a first separation filter, the electrostatic latent image on the photoconductive surface is then developed by a complementary first color toner. The developed image of the first particular color is then transferred to a support material. The support material retaining the developed image of the first color is brought into position to receive images subsequently developed with other colored toners.

After transferring the developed image of the first color, the photoconductive surface is then cleaned and uniformly charged in preparation to being exposed a second time. A second filter which selectively absorbs and transmits a second color from the light passing through it is interposed in the optical projection path after the first utilized filter has been removed therefrom. The photoconductive surface is thus discharged to record a second electrostatic latent image thereon. This electrostatic latent image then moves through a second development station which develops the second image with a second complementary colored toner. The developed image is then transferred to the support material in superposition with the developed image of the first color toner already adhering thereto.

By repeating this process a desired number of times, a color reproduction is formed on the support material. The support material then moves into a fusing area where the colored reproduction may be permanently affixed thereto. Although not so limited, three cycles of the process may be utilized whereupon the image is developed with yellow, magenta and cyan toner. In such a three color system, different color separation filters are used to subtractively produce the color reproduction. These filters may be red, green and blue.

The color xerographic process produces excellent results for the reproduction of line copy, e.g., printed characters such as letters or numerals, but presents inherent difficulties where the copy to be reproduced comprises large solid areas of high density or a continuous tone image of varying density such as a photograph. At this point, a clear distinction is to be made between the problem of xerographic reproduction of dense solid areas of an original and accurate xerographic reproduction of density gradients in the highlight and shadow regions of continuous tone originals having areas of varying densities.

The former is a development problem associated primarily with an open cascade development system which problem has been largely overcome by employing specific development techniques or by altering the charge pattern present on large areas of contiguous charge on the photoreceptor, as hereinafter discussed. The latter is partially a development problem and partially a problem inherent in a high contrast and moderate range process such as xerography caused by the inability of a given photoreceptor to sense or appreciate, and consequently reproduce, small density gradients in the highlight and shadow areas of a continuous tone original such as a photograph. It is the solution of this latter problem by extending the range and improving the tone reproduction response of the xerographic process toward which the present invention is directed.

Various techniques have been proposed in the prior art to improve solid area cascade development in the xerographic process. Briefly, the problem of solid area development is due to electric field conditions in the regions of large contiguous areas of charge present on the photoreceptor. Xerographic development in these areas may delineate only their outline, developing only in the areas where there is a differential in charge on the xerographic surface. Consequently, the centers of these areas of uniform high charge, being large solid areas of dark input, do not attract and hold xerographic toner, and thus appear white or very lightly toned on the transfer copy sheet.

Since the problem of solid area development is primarily associated with open cascade development systems, one solution to the problem has been the adoption of development techniques other than cascade such as the well known magnetic brush, powder cloud, or liquid development systems, or by the use of development electrodes as for example disclosed in U.S. Pat. No. 2,777,418 to Gundlach or U.S. Pat. No. 2,952,241 to Clark et al.

Another approach towards the solution of the problem of solid area development has been to break up the continuous charge pattern on the photoreceptor using mechanical, optical, or electrical techniques. For example, Carlson suggests in U.S. Pat. No. 2,599,542 that improved solid area coverage is obtained using an electrophotographic plate which has been etched to resemble a waffle-grid design, the depressions on the surface of which plate are filled with a photoconductive substance. Weigl in U.S. Pat. No. 3,248,216 teaches selective discharge of a charged electrostatic plate by contacting the plate with a conductive element such as a metallic gravure roller having a dot pattern provided by ridges or projections, followed by exposure of the semi-discharged plate to the image. Optical techniques for improving solid area coverage by breaking up the charge area on an electrophotographic plate involve exposing the plate after charging and prior to or subsequent to imaging to a screened light source. The screen may take the form of a line or comb screen or dot pattern. The plate is selectively discharged in those areas where the light passes through the screen but retains its charge in those areas blocked by the opaque areas in the screen. Examples of optical techniques for improving solid area coverage may be found in U.S. Pat. Nos. 2,598,732, 3,121,010, 3,212,888, 3,335,003, and 3,535,036.

The use of screens consisting of alternating opaque and transparent areas positioned between the object to be imaged and the photoreceptor has also been suggested in the prior art as a means for breaking up solid area images to allow uniform development. For example, Pendry in U.S. Pat. No. 3,152,528 teaches a document screen adapted to be superimposed over the document to be copied between the document and the lens system of a xerographic copy machine. The screen comprises a transparent base material having printed thereon a plurality of opaque dots or lines which serve to break up any dark or continuous tone areas present on the document to be copied. Typical of such screens, which have been in commercial use for the past several years, are those consisting of a pattern of reflecting white dots on a transparent substrate. These dots cover about 30% of the area of the screen and are arranged in a square array with a frequency of about 60–65 dots per inch.

Because of the improved solid area coverage in xerographic copies achieved by the above techniques in shadow and middle tone areas of an original such as a continuous tone photograph, the casual observer is impressed that the process has been sensitized to the point where it can "see" and consequently reproduce not only solid areas but also density gradients in the middle tone areas of the original. However, the use of such mechanical, electrical or optical discharge techniques, or of reflecting document screens wherein the opaque patterns of the screen appear faithfully reproduced on the solid areas of output copy, does not serve to significantly extend the range of the process; that is, small input density gradients in the highlight and shadow areas of the original are not shown as concomitant changes in output density in the copy.

Donald in U.S. Pat. No. 3,627,526 suggests a masking technique for improving gray scale range in an electrophotographic process by using a partially light transmitting contact screen in contact with the photoconductive member. The patent indicates that light passing through the partially transmitting areas of the screen will discharge that portion of the photoconductor to a lesser degree than adjacent light passing through the transparent areas of the screen, resulting in a dot pattern of various shades in the various areas of the copy. These dots are not modulated in area as in conventional halftone. Changing from one screen to another or removing the screen altogether in the Donald process involves the awkward step of replacing or reprinting photoconductive surfaces.

The range of an electrophotographic system is usually defined in terms of the input exposures over which changes in output density can be observed. Range can be shown graphically using a tone reproduction curve (TRC) wherein input density expressed in terms of $\log_{10}(100/R_o)$ is plotted against output density expressed in terms of $\log_{10}(100/R_c)$, where $R_o$ is the percent spectral reflectivity of the original and $R_c$ is the percent spectral reflectivity of the copy. Thus, where the reflectivity approaches 100% (white areas), the density approaches 0 ($\log_{10} 100/100=0$); where the reflectivity decreases, (colored areas), the density increases. For example, at 10% reflectivity, the density is 1; at 1% reflectivity, the density is 2. A typical TRC of solid area xerography embodying a selenium photoreceptor plotted over a plurality of input densities is shown as the solid curve in FIG. 1. For the purposes of the present invention, the range is defined as the density differential on the abscissa axis between points where the slope of the "S" shaped TRC is 0.5. The range of the system shown in FIG. 1 is about 0.6.

The TRC in FIG. 1 illustrates clearly why normal xerographic systems have a limited capability in reproducing pictorial originals. Opaque photographs typically have a density range in the order of about 1.5 (Dmax = 1.6: D min = 0.1) and simply cannot be accurately reproduced by a system with a range of 0.6. Varying the exposure above or below the point where the minimum output density occurs for an input density of zero serves merely to shift the TRC with no range extension and at the cost of sacrificing shadow or highlight information. In fact, range extension can be achieved only by "flattening" the TRC curve to approach as nearly as possible the dotted straight line of FIG. 1 which represents the optimum faithful reproduction of all densities.

Compound document screens composed of a mixed dot pattern of absorbing black dots and reflecting white dots have been proposed for extending xerographic range in both color and conventional black and white xerography, as disclosed in copending application Ser. No. 408,707, filed Oct. 23, 1973 now U.S. Pat. No. 3,905,822. While screens of the type disclosed in the copending application are suitable for use in color electrophotography, they are relatively inflexible with regard to affecting the color balance or hue rendition of the copy in a color process. Also, it is found that the halftone dot pattern in the color copy produced by a color process such as recited above consists of overlapping dots consisting of a mixture of the three subtractive primary colors. Thus, for example, copies of colored originals made on a Xerox brand 6500 color copy machine using such a document screen are found to contain cyan, magenta and yellow halftone patterns with the dots of each color lying on top of one another. This situation gives rise to a significiant moire problem in the color process and a disadvantage in the perceptual sensation of color saturation.

Accordingly, it is an object of the present invention to provide a simple and economical means for improving the range capabilities of high contrast and moderate or low range electrophotographic processes.

Another object is to provide a simple screening technique for use in a color electrophotographic method which both extends the range of the process and reduces moire.

A more specific object is to extend the range of a color xerographic process whereby a xerographic halftone image of improved color purity and saturation is formed.

SUMMARY OF THE INVENTION

The foregoing and other objects of the invention are realized by providing a halftone compound document screen to be used proximate to an original document to be copied at the exposure station in a color electrophotographic process. The halftone screen is constructed of a clear transparent substrate material having on at least one surface thereof a plurality of colored dots, and is adapted to be positioned proximate to, preferably in contact with, the face of the document to be copied between the document face and lens system employed in the electrophotographic system. The dots present on the screen may comprise dots of a single color or a mixed or compound dot pattern of dots of different colors. The periodicity and array of these dots is such that light reflected by the screened original is altered by the optical system in accordance with the Optical Transfer Functions of the particular system employed such that the system passes the fundamental spatial frequencies in the screen pattern and attenuates the harmonic spatial frequencies in the pattern. Spatial modulation of a continuous tone image on an original document by screening according to the present invention gives rise to an area modulated pattern of halftone dots in the copy. In the preferred embodiment, the copy image of a continuous tone colored original is found to consist of a rosette shaped pattern of colored halftone dots of varying sizes, the sizes of these dots varying in accordance with the spatial modulation of the various areas of the screened original. Accordingly, minute changes in density in all areas of the original document, including highlight and shadow areas, are accurately recorded as minute changes in halftone dot size, thereby conveying the impression of accurate electrophotographic reproduction of density gradients and effectively extending the range of the electrophotographic process.

DETAILED DESCRIPTION OF THE INVENTION

Figure 1:
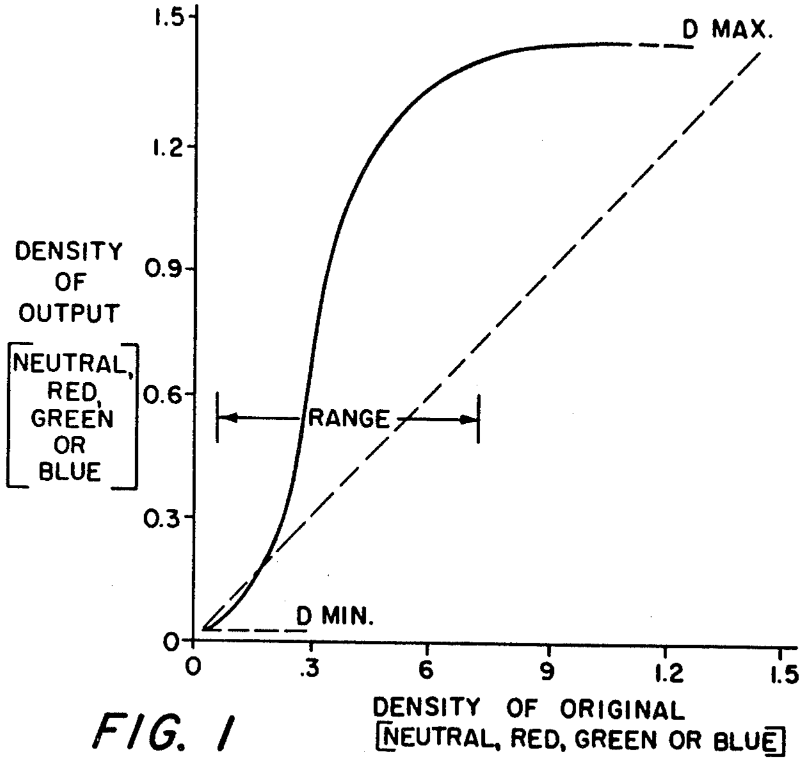
FIG. 1 is a tone reproduction curve for a typical xerographic system embodying a selenium photoreceptor.

As indicated above, the present invention involves specific halftone screening techniques to extend the range of high contrast electrophotographic processes. The invention is specifically described as applied to the color xerographic process but it should be understood that it is equally applicable to any color electrophotographic process involving projection through a lens of an image reflected from a colored or black and white original document onto a photosensitive member, such as the photoelectrophoretic process exemplified in U.S. Pat. No. 3,384,566, the manifold imaging process exemplified in U.S. Pat. No. 3,707,368 and like processes.

The halftone screen used in the present invention comprises clear transparent support material having clear areas and colored areas, the colored areas consisting of a dot pattern of appropriate frequency comprising a plurality of colored dots of one or more different colors. The dots may be substantially opaque, or substantially transparent, or of intermediate transparency, and may be of uniform or non-uniform density. The term "dots" as used herein is intended not only to encompass dots in the classical sense such as the circular shapes depicted in FIGS. 3-6, but also is intended to encompass areas of substantially uniform density forming other geometrical shapes such as elipses, squares, triangles or polygons in general, inasmuch as any of these shapes proves operable in the present invention. The dots may be of any color in the visible spectrum, and mixed dot patterns comprising two or more different colored like dot patterns are desirably employed for most applications, as hereinafter defined. By the term "like dot" is meant dots of similar spectral reflectivity characteristics, i.e., red dots, blue dots, green dots, white dots, black dots, etc., or dots where the dominant wavelength is in a specific area of the color spectrum, e.g., the red, blue and green wavelengths as determined on a chromaticity diagram. By the term "colored dots" is meant dots which reflect or transmit light preferentially in the visible range of the spectrum, i.e., wavelengths in the range of about 400 to 700 millimicrons. The term is not intended to encompass purely reflecting white dots or absorptive black dots. The base material supporting the dot patterns may comprise any clear transparent material such as glass or plastic. Clear films made from flexible plastics, such as polyesters, methacrylate polymers or vinyl halide polymers and having a thickness of less than about 100 mils, are especially preferred because such screens can be used with both flat and curved platen electrophotographic machinery.

The dot pattern may be of any color in the visible spectrum, the particular color or colors of individual like dots in the pattern being a matter of selection for one skilled in the art depending on the type of color balance desired in the copy rendition of the original. Thus the individual like dots may be one or more of the primary additive colors such as red, blue or green or may be one or more subtractive colors such as cyan, magenta or yellow. The dots may also be shades of the above such as orange, blue-green, purple, brown and the like. The dots may also comprise one or more of the above individually colored dot patterns in a mixed pattern with a substantially light reflecting white dot pattern, a substantially light absorbing black dot pattern, or a mixed white and black dot pattern such as is disclosed in copending application Ser. No. 408,707. Thus, screens within the scope of the present invention would include those containing dots of a single additive primary color, dots of one primary color in pattern with dots of another primary color, dots of three primary colors in pattern, dots of one subtractive primary color, dots of two or more subtractive colors in pattern, dots of one or more primary colors in pattern with dots of one or more subtractive colors, and any of the above in pattern with black and/or white dots.

The frequency of the screen dot pattern is defined for the purposes of the present invention in terms of the average period of like dots present on a given linear or area measurement of screen surface. This frequency is the reciprocal of the average period of like dots and can be defined by the equation: $f = 1/P$, where $P$ equals the average distance between the geometrical center of one like dot and its closest like dot neighbor of the total like dot population per linear or area measurement of screen surface. Thus, a screen having a like dot inch frequency of about 100, or the equivalent like dot millimeter frequency of about 4, would be a screen where the average distance between the centers of like dots present in 1 linear inch or linear millimeter, or 1 square inch or square millimeter where the dots are not in rectilinear array, would be about 0.01 inch or about 0.25 millimeter respectively.

As pointed out above, the relationship between the frequency and array of the dot pattern present on the screen and the light pattern incident on the photoreceptor is determined by the frequency response function, specifically, the Optical Transfer Function of the particular optical system employed in the electrophotographic process. The relationship between spatial frequency and optical response function is discussed, inter alia, in "Optics: A Short Course for Engineers and Scientists," Charles S. Williams and Orville A. Becklund, John Wiley and Sons, New York, N.Y., 1972, at pages 215 through 228. For a given electrophotographic apparatus, Optical Transfer Functions may be characterized in terms of the Modulation Transfer Function (MTF) of the lens, machine vibration, defocusing of the object and curvature of the photoreceptor. For a given optical system the frequency of the dot pattern is too low if the dot pattern is accurately imaged by a properly focused lens, for in this case the aerial image of the dot pattern would be a square wave which according to conventional Fourier analysis comprises sine waves at the fundamental dot pattern frequency and many higher harmonics. Such a square wave aerial image produces only a single dot size on the photosensitive member rather than a variety of dot sizes for different input densities. Conversely, the frequency of the dot pattern is too high if the dot pattern is completely smeared by the lens, since in this case resolution of the dot pattern would be completely lost giving an unmodulated image and producing no dot pattern whatever on the photosensitive member. Optical systems commonly employed in most electrophotographic processes and in commercially available xerographic color equipment begin to exhibit the desired modulation at a spatial like dot millimeter frequency of about 2, or a like dot inch frequency of about 50, and modulation may be lost completely at like dot millimeter frequencies ranging anywhere from about 6 to about 16, or like dot inch frequencies of approximately 150 to 400, depending on the quality of the optical system. Thus, for the purposes of the present invention, halftone screens having a like dot inch frequency within the range of about 50 to 400 are generally suitable. Specifically, the optical systems commonly used in the xerographic process or in xerographic equipment is such that compound screens having a uniform like dot inch frequency within the range of about 70 to 150 are sufficient for appropriate image modulation such that the optical system will pass the fundamental spatial frequencies and attenuate the harmonic spatial frequencies.

The fundamental and harmonic frequencies of the screen dot pattern mentioned above refer to the frequencies of sine waves required to synthesize the reflectivity patterns of like dots within the screen according to conventional Fourier analysis. Within the scope of this invention it should be appreciated that like dots may be positioned in any regular array or may occupy random positions with respect to other like dots. Examples of the regular array would be square, triangular, rhombohedral or hexagonal lattices, with the fundamental screen frequency defined by the basic periodicity of the array of like dots. The frequency is given $f = 1/P$ where $P$ is the average distance between like dots per rectilinear measurement of screen surface. In the random case, the fundamental frequency is substantially that defined where P is the average distance between one like dot and its closest like dot neighbor in the random array per area of screen surface. Although the like dots may occupy completely random positions in the random array, it has been found to be advantageous for like dots of the same color not to overlap. It should also be pointed out that with the mixed dot pattern it is not necessary that the frequency of one like dot pattern be identical to the frequency of another different like dot pattern, nor is it necessary for the frequency to be uniform on all areas of screen surface, so long as the frequency of each like dot pattern is sufficient to achieve appropriate modulation within the modulation or frequency parameters specified above.

Figure 3:
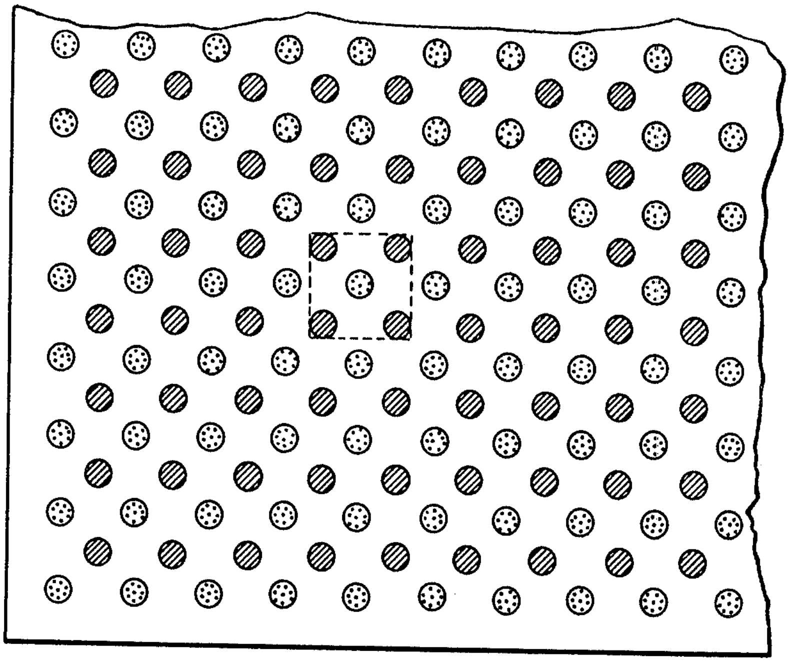
FIG. 3 is an enlarged view of a small area of compound screen having a pattern of differently colored like dots arranged in a body centered pattern.

One embodiment of dot array is the body centered regular pattern shown in FIG. 3 which consists of a plurality of square arrays of like dots surrounding a centrally positioned different dot. The square array in FIG. 3 is depicted in the cell area encompassed by the dotted line which shows four like dots, for example red, in a square array with a different dot, for example cyan, positioned at the intersection of red dot diagonals. Of course, the array may be equally described at another area as four cyan dots in a square array surrounding a centrally positioned red dot. Assuming the like dot inch frequency of the red and cyan dots of the compound screen of FIG. 3 to be 100, this means for the purposes of the present invention that there is a repetitive two dimensional pattern of 100 red dots along each of two mutually perpendicular rectilinearly directed imaginary lines one inch long encompassing a common end dot and 100 cyan dots along each of two mutually perpendicular different rectilinearly directed imaginary lines also one inch long and encompassing a common end dot. Thus, one square inch of compound screen surface with a body centered like dot inch frequency of 100 would contain approximately 10,000 red dots and 10,000 cyan dots.

Figure 4:
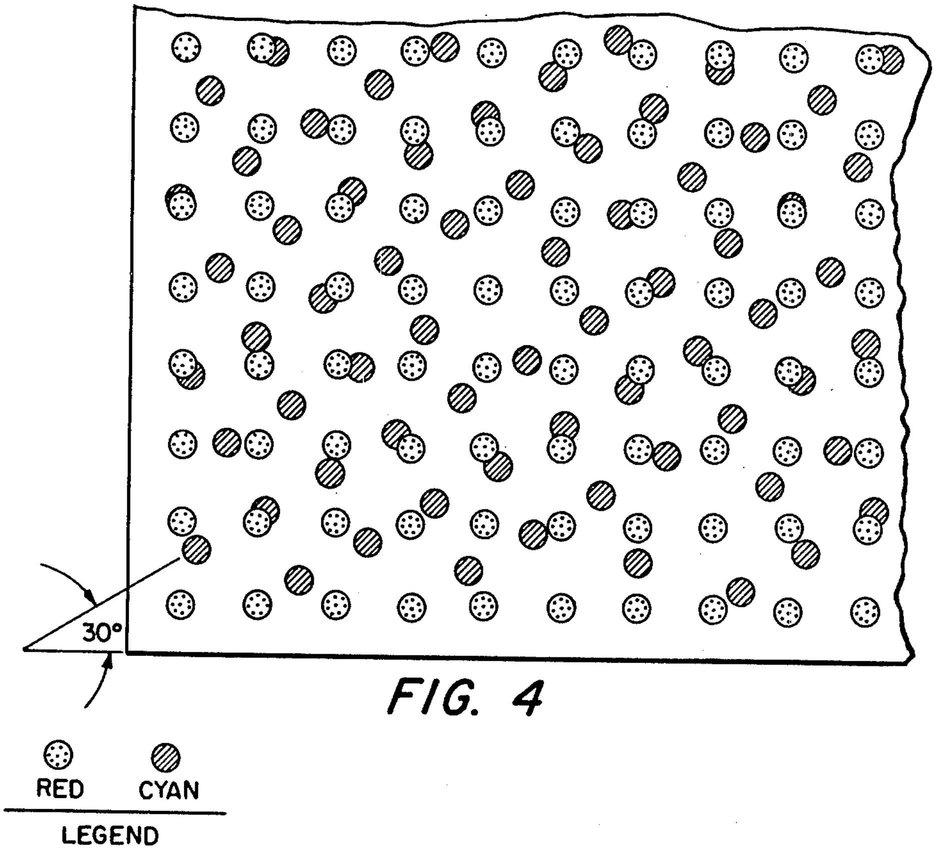
FIG. 4 is an enlarged view of a small area of compound screen having a pattern of differently colored like dots arranged at a suitable angle to achieve randomization of the dot pattern.

Although the body centered pattern of FIG. 3 is very desirable in terms of dot pattern spatial array for two different dot patterns, it is often a tedious and relatively expensive matter to prepare screens where the body centered pattern can be accurately reproduced throughout a large screen area, particularly at higher screen frequencies. Improper registration of the body centered pattern at various areas of the screen can give rise to an undesirable moire pattern which adversely affects the modulation of the dot pattern. Accordingly, a simpler realization of the compounds screen is a random mixed dot pattern which may be achieved by orientating a first like dot and a second different like dot linear array at a suitable angle to achieve randomization and minimize moire. This is best accomplished by orientating a regular linear array of like dots at a suitable angle, such as about 30° or about 60°, with respect to a regular linear array of different like dots. In this type of array, the relative spacing of the different colored dots is not uniform as in the body centered pattern and, in fact, at various areas of screen surface some of the differently colored dots will overlap. An example of a dot pattern formed by superimposing a linear red dot screen over a linear cyan dot screen orientated at an angle of 30° is shown in FIG. 4. As in the case of compound screens having a body centered pattern, the inch frequency of like dots in the orientated array should be within the range of 50 to 400 for best results.

In most cases of electrophotographic reproduction it will be desirable that the document screen be essentially neutral, i.e., that all primary colors be represented. Neutrality is best approximated in the two like dot pattern by employing one of the additive primary colors and its complementary subtractive primary. Thus, a red dot pattern, which is highly reflective in the red portion of the spectrum, may be combined with a cyan dot pattern, which is absorptive in the red portion of the spectrum, but reflective in the green and blue portions of the spectrum. For the same reasons, blue dots are logically used with yellow dots, and green dots are logically used with magenta dots.

Figure 5:
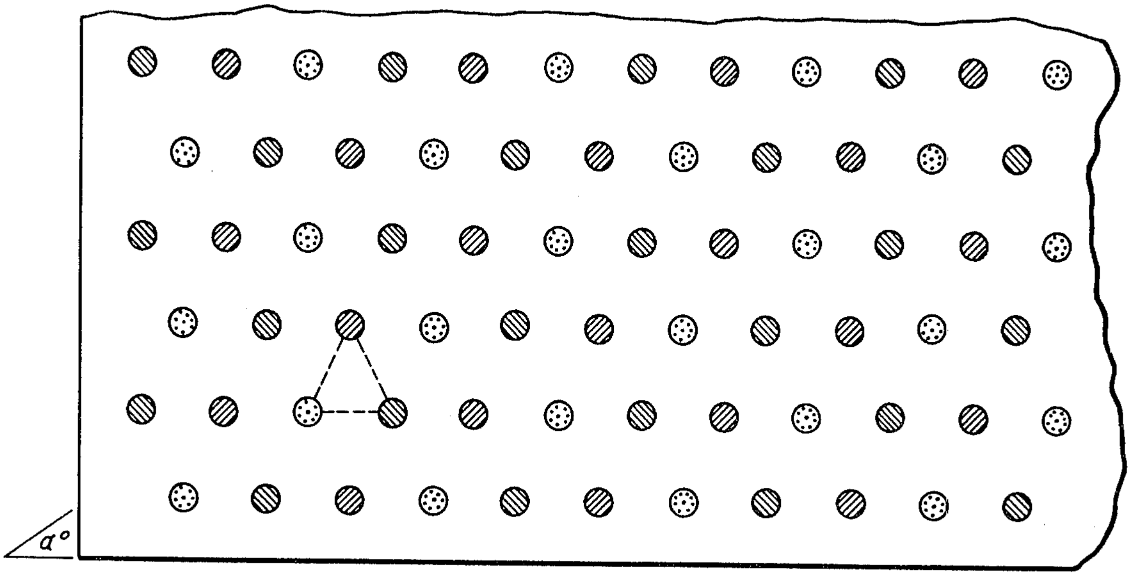
FIG. 5 is an enlarged view of a small area of suitable compound screen pattern of three different colored dots on a transparent substrate arranged in a triangular lattice pattern.

Neutrality may also be approximate using a mixed dot pattern of three additive primary colors, i.e., red, blue and green dots. One embodiment of a three different like dot array is the rhombohedral lattice such as shown in FIG. 5. In the array as shown, red, green, and blue like dots lie along rectilinear directed lines forming an angle alpha of about 37° with the horizontal. Alpha may vary from 0° to 90°. Differently colored dots in the array of FIG. 5 form a triangular pattern as shown in the dotted line area of the figure. A rhombohedral or diamond shaped cell pattern is formed by connecting the four closest like dots.

Figure 6:
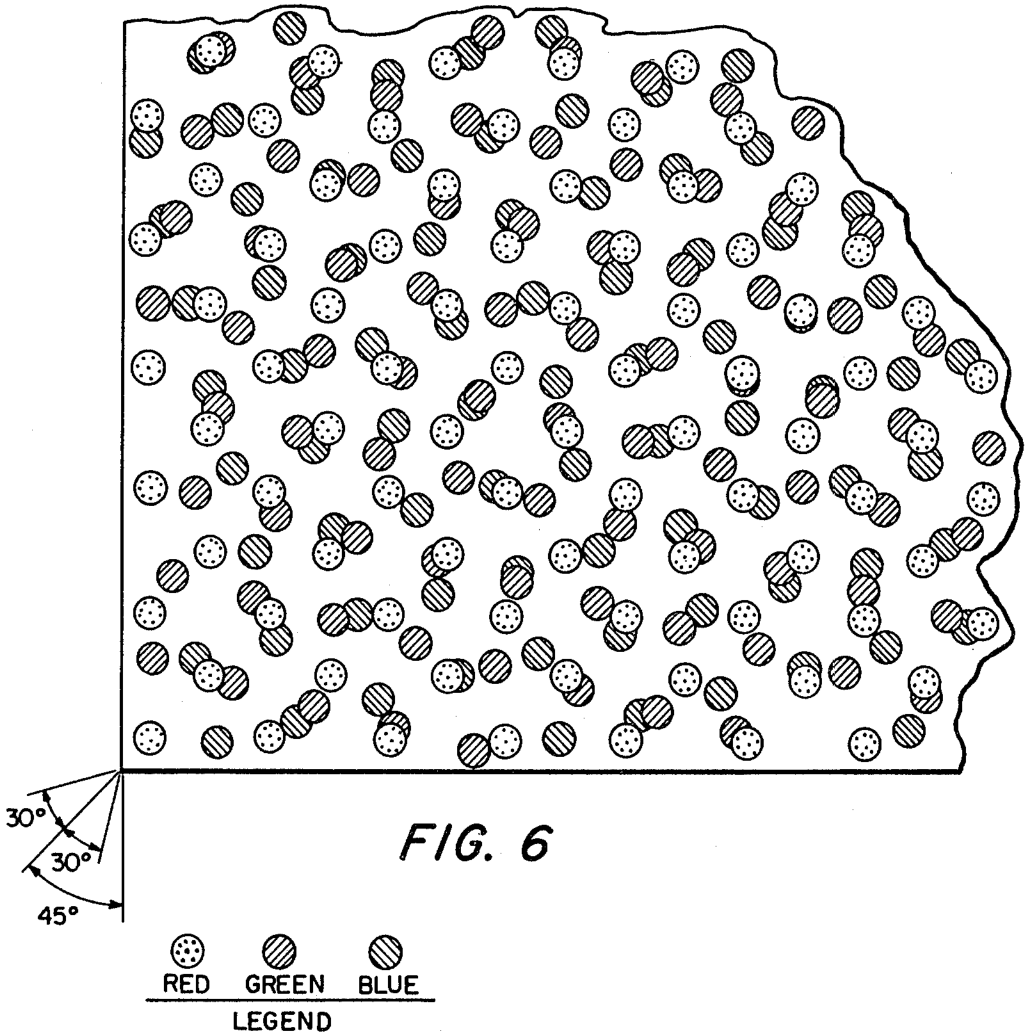
FIG. 6 is an enlarged view of a small area of a compound transparent screen containing dots of three different colors comprising a first screen containing dots of a first color superimposed over a second screen containing dots of a second color superimposed over a third screen containing dots of a third color and each arranged at a suitable angle to achieve randomization of the dot pattern.

Like the body centered pattern described above, the rhombohedral pattern is difficult to accurately reproduce over a large area of screen surface. Thus, a random three like dot pattern may be produced by orientating regular square rectilinear arrays of each like dot at suitable angles to minimize moire. Such a screen pattern is shown in FIG. 6, with an angle of 30° between all the colors. With such a construction, it is preferable that the strong color desired for emphasis in the electrophotographic rendition be aligned at an angle of about 45° with the horizontal with the remaining arrays at angles of ± 30° with the strong array. Since there will necessarily be some overlap of different colored dots in such a pattern, it is also preferable that the strong color be the topmost such that no other color superimposes it. Such a screen should be used with the strong color side facing the lens system. Screens containing one, two or three patterns of colored dots in combination with black and/or white dots can be prepared as above with black or white dots arrayed at any angle, and with black and white dots arrayed at mutually moire reducing angles.

Figure 2:
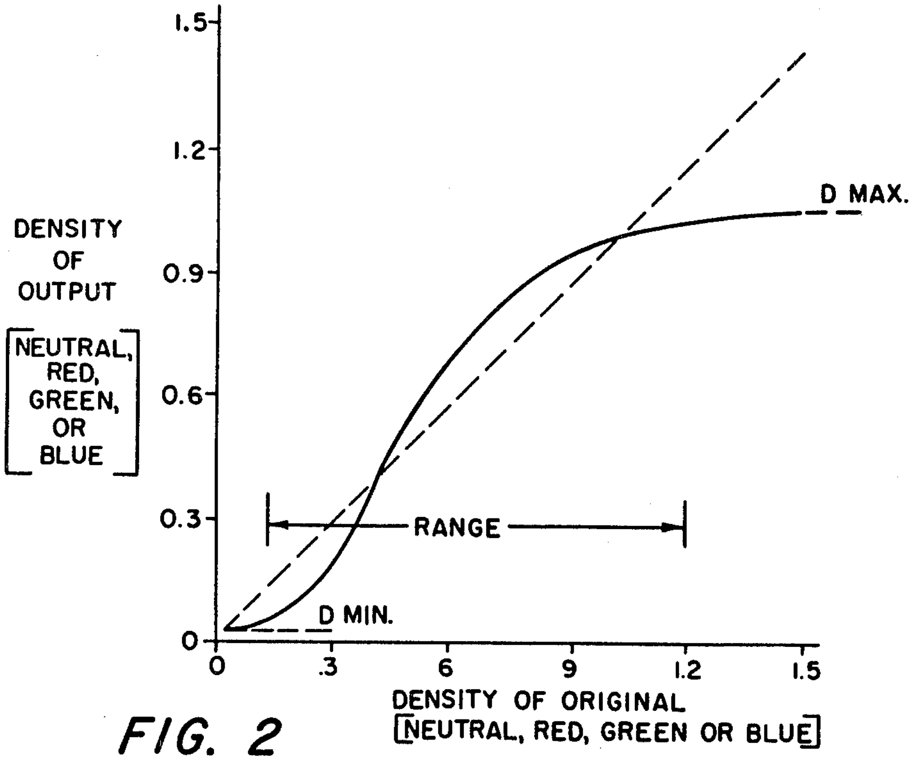
FIG. 2 is a tone reproduction curve for a xerographic system employing a selenium photoreceptor and embodying a document screen according to the present invention.

The mixed dot pattern forming the compound screen serves to extend the range of the color xerographic process in both the highlight and shadow areas of a continuous tone original document, with absorbing dots modulating in the highlight areas of the original and reflecting dots modulating in the shadow areas of the original. Such range extension is depicted graphically in FIG. 2, with optimum tone reproduction curve shape depicted by the dotted line. The degree of range extension achieved in the highlight or shadow areas is controlled within certain limits as a function of the relative surface area of the compound screen containing absorbing dots and reflecting dots respectively. Thus, in the color xerographic process where light reflected from an original is first passed through a blue filter onto a photoreceptor surface and the latent image developed with yellow toner, the aerial modulated light pattern eminating from a light gray document in the vicinity of a blue dot present on a superimposed document screen of the present invention would give rise to a modulated dot discharge pattern on the photoreceptor, which pattern would remain relatively undeveloped during yellow development, but which would be developed during the green and red filtering steps by additive combination of magenta and cyan toners respectively. This is because these blue dots are substantially reflecting during imaging through a blue filter and substantially absorbing during imaging through a red and green filter. The same holds true for dots of other colors, i.e., red dots are reflecting through a red filter and absorbing through a blue and green filter; green dots are reflecting through a green filter and absorbing through a red and blue filter. In this way, a three colored additive dot pattern on the screen produces a three colored modulated non-overlapping rosette dot pattern on the copy sheet. In the same manner, cyan dots are absorbing through a red filter and reflecting through a green and blue filter; yellow dots are absorbing through a blue filter and reflecting through a green and red filter; and magenta dots are absorbing through a green filter and reflecting through a blue and red filter. Black dots on the screen would be absorbing through all filters while white dots would be reflecting through all filters. It should be thus evident to one skilled in the art that color balance, color saturation and color emphasis of the copy rendition of an original can be greatly influenced by the various combinations of different colored dots present on the document screen.

The relative proportion of the area of the screen covered by dots may vary as a factor of the type of electrophotographic process in which the screen is to be used, the nature of the particular continuous tone document to be copied, and exposure limitations in the electrophotographic process. In general, it has been found that desirable results in terms of range extension in the xerographic process have been achieved using compound screens having from about 1% up to about 65% area coverage. As the non-white dot area increases from 1%, additional exposure in the form of increased document illumination or longer exposure time of the screened document will be necessary to compensate for the colored or black dot absorbance of the screen. Thus, the composition of a screen to suit a particular process, apparatus or category of document may require some trial and error work within the parameters specified above on the part of the technician to achieve optimum results in terms of range extension.

For pictorial reproduction via the xerographic subtractive color development mode, screens having about 30% total dot coverage, composed of about 10% red, 10% blue and 10% green dots have been found to be quite satisfactory. Similar screens composed of 10% cyan, 10% yellow and 10% magenta dots are also suitable. For flesh tone work, it may be desirable to emphasize the red to give a more saturated red in the copy rendition. This may be accomplished by providing a screen having larger red dots, say 12% red, 9% blue and 9% green, or by using red and cyan dots. Blue and green emphasis may be obtained in an analogous manner. In some cases, improved color balance may be achieved by combining colored dots with black absorbing dots. Use of such document screens may require roughly double the unscreened exposure to achieve accurate xerographic reproduction of the original, particularly where three or more different colored dots, or black dots are present. Where such screens are used with commercially available xerographic equipment, it may be necessary to modify the equipment to increase the exposure either by providing additional exposure lamps, by using exposure lamps of higher lumen values, by slowing down the equipment to provide a longer exposure time of the document to the photosensitive member, or by combinations of these.

The halftone screen is designed for use proximate the original document at the exposure station in an electrophotographic process. By the term "proximate" is meant that the screen is used positioned either in direct contact with the image face of the original document or at a distance away from the image face within the focal capabilities of the lens, usually not greater than about ¼ inch.

The compound screens of the present invention may be fabricated by printing, etching, dye transfer, photographic processes or other well-known techniques which are employed to prepare analogous screens used in the graphic arts. The simplest and most effective procedure is to print directly onto the clear transparent base member by offset printing techniques using appropriate dyes, inks or pigments to provide the desired colored dot patterns. The total percentage of dot area coverage at a given frequency for a given area of screen may be established by controlling the size of the dots printed on the screens, i.e., the larger the fixed frequency dot size, the greater the area of dot coverage. The relative proportions of like dot area coverage by each colored dot can be controlled in the same manner. For example, to print a compound screen having a like dot inch frequency of about 100, or a like dot millimeter frequency of about 4, with a total dot area coverage of 30% consisting of non-overlapping 10% red dots, 10% blue dots, and 10% green dots, simple calculations indicate that each of the approximately 16 red, 16 green and 16 blue dots per square millimeter should be printed to occupy an area of about 0.0063 square millimeters per dot. To print a screen of the same frequency having 25% area coverage where red dots account for about 15% screen coverage and cyan dots account for about 10% screen coverage, each of the 16 red dots should be printed to occupy an area of about 0.010 square millimeters and each of the 16 cyan dots should be printed to occupy an area of about 0.006 square millimeters. Where dots overlap as in FIGS. 4 and 6, statistics indicate that about 10% of an underlying dot pattern will be covered or hidden by a superimposed dot pattern. Thus, where the same degree of coverage is desired in all dot colors, underlying dots should be made larger in size.

Compound screens of regular array having the body centered dot pattern similar to that shown in FIG. 3 or the rhombohedral pattern of FIG. 5 may be printed on a clear transparent substrate by first applying dots of ink of one color to one side of the substrate, and subsequently applying dots of ink of the other color or colors in proper spatial array to the same or opposite side of the substrate. Alternatively, compound screen patterns of regular array may be provided by separate sheets or layers of substrate with dots of one color printed on each sheet such that when the sheets are superimposed and fixed in place, the body centered pattern of FIG. 3 or FIG. 5 is evident. The orientated compound screen patterns of FIGS. 4 and 6 may be printed in a similar fashion by first printing dots of one color on one side of the substrate and subsequently printing dots of the other color or colors on the same or opposite side of the substrate, care being taken to insure that all like dot arrays are printed orientated at suitable linear angles to minimize moire, e.g., angles of plus or minus 30°, with respect to other like dot arrays. With this technique, no specific care need be taken with regard to the relative spatial array between different colored dots. Alternatively, each like dot color may be printed on separate sheets, and a compound screen formed by superimposing and orientating these sheets at appropriate linear dot angles. The laminated sheets may then be fixed in place such that relative movement of the sheets is prevented. followed by trimming to the desired screen dimensions. Unitary screens similar to any of the above may also be prepared by photographic techniques.

As previously indicated, the compound halftone screen of the present invention is suitable for use in any electrophotographic color imaging process and designed to be positioned proximate to, preferably adjacent and in substantial contact with, the image face of the original to be copied, and between the original and lens system employed in the electrophotographic process. The compound screens are particularly adapted for the xerographic process as halftone document screens used in contact with the image face of an opaque, colored or black and white original document such as a continuous tone photograph. Light illuminating the original passes through the transparent areas of the screen and is selectively reflected or absorbed by the colored dot areas of the screen. The pattern of light reflected by the screened original is passed through a lens system and focused on a charged photoconductive plate. This spatial modulation of a continuous tone image on an original document gives rise, after xerographic development of the latent image formed on the plate, to an area modulated pattern of halftone dots in the copy, said dots varying in size and density as a function of the screened output density in various areas of the original. With black and white originals, tone reproduction properties can be varied by using light filtering techniques to change the system spectral sensitivity.

The dimensions of the compound screen should be sufficient to cover either the entire image area of the document or selective pictorial areas of the document. Thus, an 8½ × 11 inches opaque original photograph requires an 8½ inches by 11 inches screen. Other originals containing both pictorial and line copy may employ screens of dimensions sufficient to cover the pictorial copy only. When used with commercial xerographic equipment, the compound screen is simply positioned at the platen or exposure station and the original document placed over it. If desired, the glass platen of a xerographic apparatus may itself constitute the screen, having the appropriate dot pattern directly affixed thereto.

While the invention has been described with reference to the structure disclosed herein, it is not confined to the specific embodiment set forth, and this application is intended to cover such operative modifications or changes as may come within the scope of the following claims.

What is claimed is:

1. In a color electrophotographic imaging process comprising one or more sequences wherein an original document is provided at an exposure station, illuminated, and light reflected from said illuminated original document is passed through a color filter and lens system and directed onto a charged photosensitive member sufficient to form a latent electrostatic image thereon, the improvement comprising conducting said imaging process with a document screen positioned proximate to the image face of said original document between said document and said lens system, said document screen comprising:

a clear transparent substrate material having clear areas and bearing colored areas;

said colored areas comprising at least one repetitive pattern of like dots of one color;

said like dots arranged with respect to other like dots at an average like dot inch frequency such that the optical system employed in the electrophotographic process passes the fundamental spatial frequencies and attenuates the harmonic spatial frequencies.

2. The process of claim 1 wherein said colored areas comprise a mixed dot pattern of repetitive like dot patterns of at least two different colors.

3. The process of claim 2 wherein one like dot pattern is an additive primary color and another like dot pattern is a subtractive primary color.

4. The process of claim 3 wherein the subtractive color is the complement of the additive color.

5. The process of claim 2 wherein said colored areas comprise a mixed dot pattern of repetitive like dot patterns of at least three different colors, said different colors being additive primary colors, subtractive primary colors, or mixtures thereof.

6. The process of claim 5 wherein said different colors comprise red, blue and green.

7. The process of claim 1 wherein the transparent substrate material further includes a repetitive pattern of black absorbing like dots, a repetitive pattern of white reflecting like dots or a mixed dot pattern of black absorbing and white reflecting dots.

8. The process of claim 1 wherein said document screen is positioned in contact with the image face of said original document.

9. The process of claim 2 wherein each of said like dot patterns on said substrate material is of substantially uniform frequency, like dots being arrayed along generally rectilinearly directed lines with respect to other like dots.

10. The process of claim 9 wherein said mixed dots on said substrate material are arranged in a body centered pattern.

11. The process of claim 9 wherein the rectilinear arrays of colored like dots are disposed at an angle with respect to the rectilinear arrays of differently colored like dots, said angle being appropriate to minimize moire and provide optimum randomization of the mixed dot pattern.

12. The process of claim 9 wherein the uniform like dot inch frequency is within the range of about 50 to 400.

13. The process of claim 2 wherein said mixed dot pattern of colored dots occupies from about 1% to about 65% of the image area of the compound screen.

14. The process of claim 13 wherein the like dot inch frequency is within the range of about 70 to about 150.

* * * * *